United States Patent [19]

Numasawa

[11] Patent Number: 5,306,672
[45] Date of Patent: Apr. 26, 1994

[54] METHOD OF MANUFACTURING A SEMICONDUCTOR DEVICE WHEREIN NATURAL OXIDE FILM IS REMOVED FROM THE SURFACE OF SILICON SUBSTRATE WITH HF GAS

[75] Inventor: Youichirou Numasawa, Tokyo, Japan
[73] Assignee: NEC Corporation, Tokyo, Japan
[21] Appl. No.: 963,569
[22] Filed: Oct. 19, 1992
[30] Foreign Application Priority Data
Oct. 17, 1991 [JP] Japan .................................. 3-268041
[51] Int. Cl.$^5$ ................... H01L 21/306; H01L 21/336
[52] U.S. Cl. .................................. 437/225; 437/983; 134/3; 148/DIG. 118
[58] Field of Search ................... 437/40, 41, 238, 239, 437/913, 946, 949, 983, 225; 427/255.4, 307; 148/DIG. 81, DIG. 118; 134/3

[56] References Cited

U.S. PATENT DOCUMENTS 5,030,319 7/1991 Nishino et al. .

OTHER PUBLICATIONS

Nishizawa, J. et al, "Ultrashallow High Doping . . . Doping", Appl. Phys. Lett. 56(14) 2 Apr. 1990, pp. 1334–1335.

Primary Examiner—George Fourson

[57] ABSTRACT

A method for forming a gate oxide film of a high reliability and a superior performance applicable to a very-large-scale integrated circuit and a manufacturing equipment for the same are disclosed. The method includes steps for treating a substrate with a HF solution, then treating with a HF gas, and subsequently treating with $H_2$ gas of a high purity, and oxidizing the substrate. The step of the $H_2$ gas treatment is carried out at a temperature equal to or above 200° C. and at a pressure equal to or below 10 Torr. The manufacturing equipment comprises loading-lock chambers between a HF gas treatment chamber and a $H_2$ gas treatment chamber and between the $H_2$ gas treatment chamber and a thermal oxidation chamber for avoiding exposure of the substrate to the air during transferring the substrate between the chambers.

7 Claims, 3 Drawing Sheets

METHOD OF MANUFACTURING A SEMICONDUCTOR DEVICE WHEREIN NATURAL OXIDE FILM IS REMOVED FROM THE SURFACE OF SILICON SUBSTRATE WITH HF GAS

BACKGROUND OF THE INVENTION

The present invention relates to a method and an equipment for manufacturing a semiconductor, and more particularly to a method and an equipment suitable for forming a gate oxide film in a MOS transistor.

PRIOR ART

In a conventional method for manufacturing a semiconductor device, such as a very-large-scale integrated circuit, a process for forming a gate oxide film is very important one. Much care should be taken especially in a pre-treatment of a silicon substrate before a thermal oxidation for forming a gate oxide film. There are two conventional methods for forming a gate oxide film different form each other in this pre-treatment process.

One of the methods is a pre-treatment with a hydrofluoric acid. With this method, a HF (hydrogen fluoride) solution containing several percent to tens of percent of HF concentration or a buffered HF solution containing said HF solution and additionally ammonium fluoride is generally used as a hydrofluoric acid. A silicon substrate is immersed in either the solution for several minutes for cleaning or treating the surface of the silicon substrate, following which the substrate is washed in water and dried, and then thermally oxidized. An atmosphere of $O_2$, $H_2O$, or the like is used for the thermal oxidation.

The other of the methods is a pre-treatment with a HF gas. A HF gas diluted with, e.g. $N_2$, is used in the pretreatment. An advantage of this method is that washing in water and drying step is not required between the pretreatment and the thermal oxidation. The thermal oxidation step is the same as in the first method.

Each of the conventional methods for forming a gate oxide film as described above has at least a problem. In case of the pre-treatment with a hydrofluoric acid, there is a problem in which a gate oxide film of a superior performance applicable to a very-large-scale integrated circuit such as a 64 megabit DRAM or a 256 megabit DRAM can not be formed, since, although a natural oxide film, which is generally formed when a silicon substrate is only exposed in the air, is removed by this treatment, another natural oxide film is formed during a washing and drying step. Additionally, the growth of the natural oxide film formed during the washing and drying step is accelerated due to a subsequent exposure to the air after the washing and drying step.

On the other hand, in case of the pre-treatment with a HF gas, there is a problem in which, although fluorine can terminate the surface of the silicon substrate thereby suppressing formation of a natural oxide film thereon, an oxide film of a high reliability cannot be formed since the fluorine is accepted as an impurity to a reverse effect within an oxide film during the subsequent thermal oxidation.

SUMMARY OF THE INVENTION

In view of the foregoing, an object of the present invention is to provide a method for forming an oxide film of a high reliability and a superior performance applicable to a gate oxide film in a very-large-scale integrated circuit such as a 64 megabit DRAM or a 256 megabit DRAM and to provide a manufacturing equipment for the same.

According to a first aspect of the present invention, there is provided with a method for manufacturing a semiconductor device including steps of treating a silicon substrate with a hydrofluoric acid, then treating the substrate with a HF gas and subsequently with $H_2$ gas, and oxidizing the silicon substrate.

Preferably, a step of transferring the silicon substrate at a reduced pressure is included in the method for avoiding exposure of the substrate to the air, between the steps of said treating with a HF gas and said treating with $H_2$ gas, and/or between the steps of said treating with $H_2$ gas and said oxidizing of the silicon substrate.

The HF gas may be one diluted with an inert gas such as $N_2$ gas. Further, the $H_2$ gas treatment may be carried out at a reduced pressure substantially equal to or below 10 Torr and at an elevated temperature substantially equal to or above 200° C.

According to a second aspect of the present invention there is provided with an equipment for manufacturing a semiconductor device comprising: a first treatment chamber for treatment a substrate with a HF gas therein; a second treatment chamber for treating said substrate with $H_2$ gas therein after said substrate is treated in said first treatment chamber; an oxidation chamber for thermally oxidizing therein said substrate after said substrate is treated in said second treatment chamber; a first loading-lock chamber disposed between said first and second treatment chambers for transferring said substrate at a reduced pressure; and a second loading-lock chamber disposed between said second treatment chamber and said oxidation chamber for transferring said substrate at a reduced pressure.

The HF gas treatment chamber, the $H_2$ gas treatment chamber and the oxidation chamber may be equipped with an evacuation equipment for avoiding exposure of the substrate to the air, respectively. The $H_2$ gas treatment chamber may also be equipped with a heater for treating a substrate at an elevated temperature.

According to the method and the manufacturing equipment of the invention, a gate oxide film of a high reliability and a superior performance can be provided, since substantially no natural oxide film degrading a thermal oxide film is formed on a substrate of a semiconductor device nor fluorine as an inpurity reducing reliability of the thermal oxide film is accepted within the thermal oxide film or an interface between the thermal oxide film and the substrate.

BRIEF DESCRIPTION OF THE DRAWINGS

Other and further objects, features and advantages of the present invention will be more apparent from the following description, referring to the accompanying drawings in which.

DESCRIPTION OF THE PREFERRED EMBODIMENTS

Now, the present invention will be described with reference to the drawings.

Figure 1A:
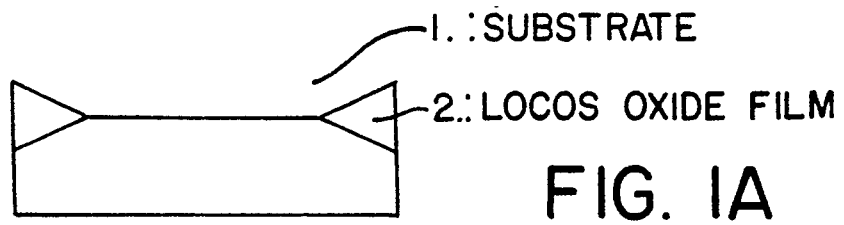
FIGS. 1A to 1E show a method according to an embodiment of the present invention, FIG. 1A showing a LOCOS oxidation, FIG. 1B showing a HF solution treatment, FIG. 1C showing a HF gas treatment, FIG. 1D showing a $H_2$ gas treatment, and FIG. 1D showing a thermal oxidation.
Figure 1B:
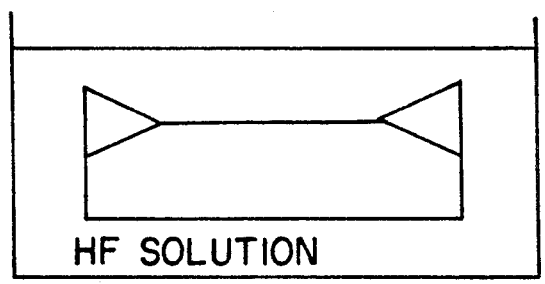
Figure 1C:
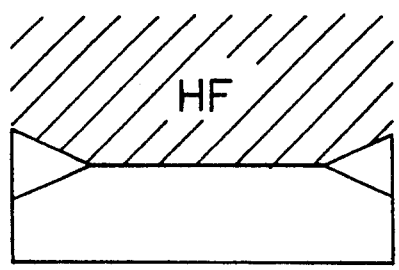
Figure 1D:
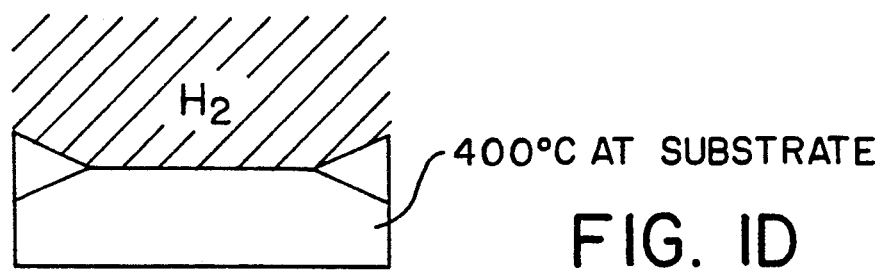

FIGS. 1A to 1E show a combination process forming an oxide film in a method according to an embodiment of the present invention. FIG. 1A shows a step in which local oxide films (LOCOS layers) 2 is just formed on a substrate 1 by selectively oxidizing a silicon wafer of a (100) orientation. The substrate 1 is then treated, as shown in FIG. 1B, with a conventional HF solution, or a hydrofluoric acid solution, described in the prior art, for cleaning the surface of the substrate. A hydrofluoric acid solution diluted by 1:30 may be used in this step. The temperature of the solution is preferably set at a room temperature, e.g. 20° C., and the treatment is carried out for about a minute, for example. Then, the substrate is treated with a HF gas, for removing a natural oxide film on the substrate 1 as shown in FIG. 1C. In this embodiment, a HF gas diluted with $N_2$ gas is used. Following the step, the substrate 1 is transferred to a $H_2$ gas treatment furnace at a reduced pressure, without exposing the substrate to the air.

The substrate 1 is then treated with $H_2$ gas for removing fluorine (F) which attaches to, or terminates, the silicon surface during the previous HF gas treatment step. The reaction of the step for removing the fluorine terminating the silicon surface is expressed by the following chemical equation:

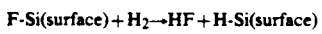

F-Si(surface) + $H_2$ → HF + H-Si(surface)

Figure 1E:
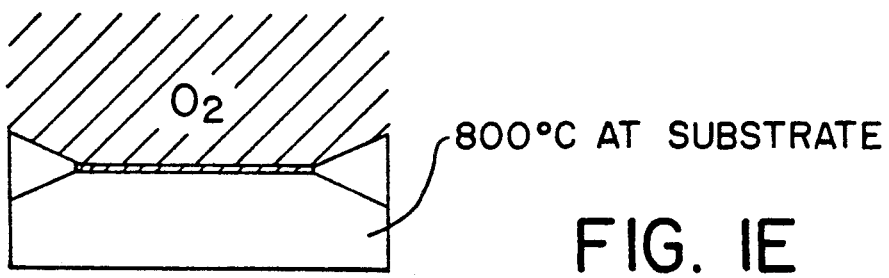

In this embodiment, the $H_2$ gas treatment is carried out under a temperature substantially equal to or above 400° C. at the substrate. The chemical reaction expressed by the equation is accelerated by the elevated temperature at the substrate. A temperature substantially equal to or above 200° C. is preferable for obtaining the effect of the $H_2$ gas treatment. The $H_2$ gas treatment is carried out at a reduced pressure substantially equal to or below 10 Torr for accelerating removal of HF gas molecules from the surface of the substrate. After the $H_2$ gas treatment is finished, the substrate is transferred, without exposing the substrate to the air, to an oxidation furnace, in which the substrate is thermally oxidized for forming a gate oxide film at an elevated temperature of 800° C. at the substrate as shown in FIG. 1E. A conventional method for forming a thermal oxide film may be employed in this step. A gate oxide film of a high reliability and a superior performance applicable to a very-large-scale integrated circuit can be achieved in these steps.

Figure 2:
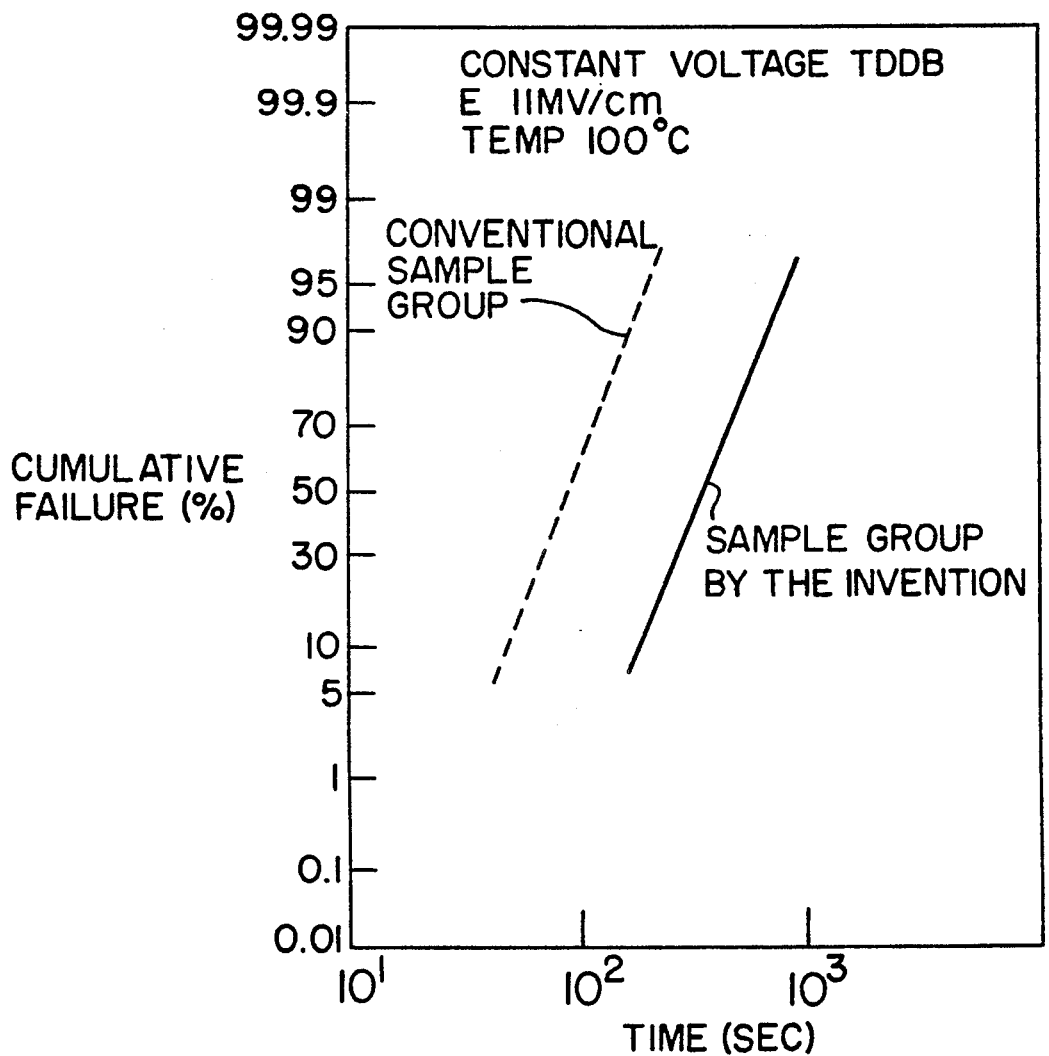
FIG. 2 is a graph showing a comparison between the TDDB reliability test result of a gate oxide film formed by the embodiment shown in FIG. 1 and that of a conventional gate oxide film.

Comparative evaluation is made between a sample group manufactured by the method as described above and a conventional sample group to which a $H_2$ gas treatment was not applied after a HF gas treatment. Each sample of both the sample groups was formed with a gate oxide film of a 80 angstrom thickness. Among the comparative evaluation, a TDDB (Time Dependent Dielectric Breakdown) test results most showed a difference between both the sample groups as shown in FIG. 2. The test was carried out by applying a voltage of 11 MV/cm to the gate oxide film at an elevated temperature of 100° C.

Samples showing breakdown in their gate oxide film were counted and accumulated in percent in both the groups and plotted as a cumulative failure versus elapsing time. As is apparent from FIG. 2, the conventional sample group showed about 50% failure while the sample group formed by the embodiment showed substantially no failure at the time 100 seconds after the application of the voltage. It is confirmed by the test that a gate oxide film of a high reliability can be formed by the method of the present invention.

Figure 3:
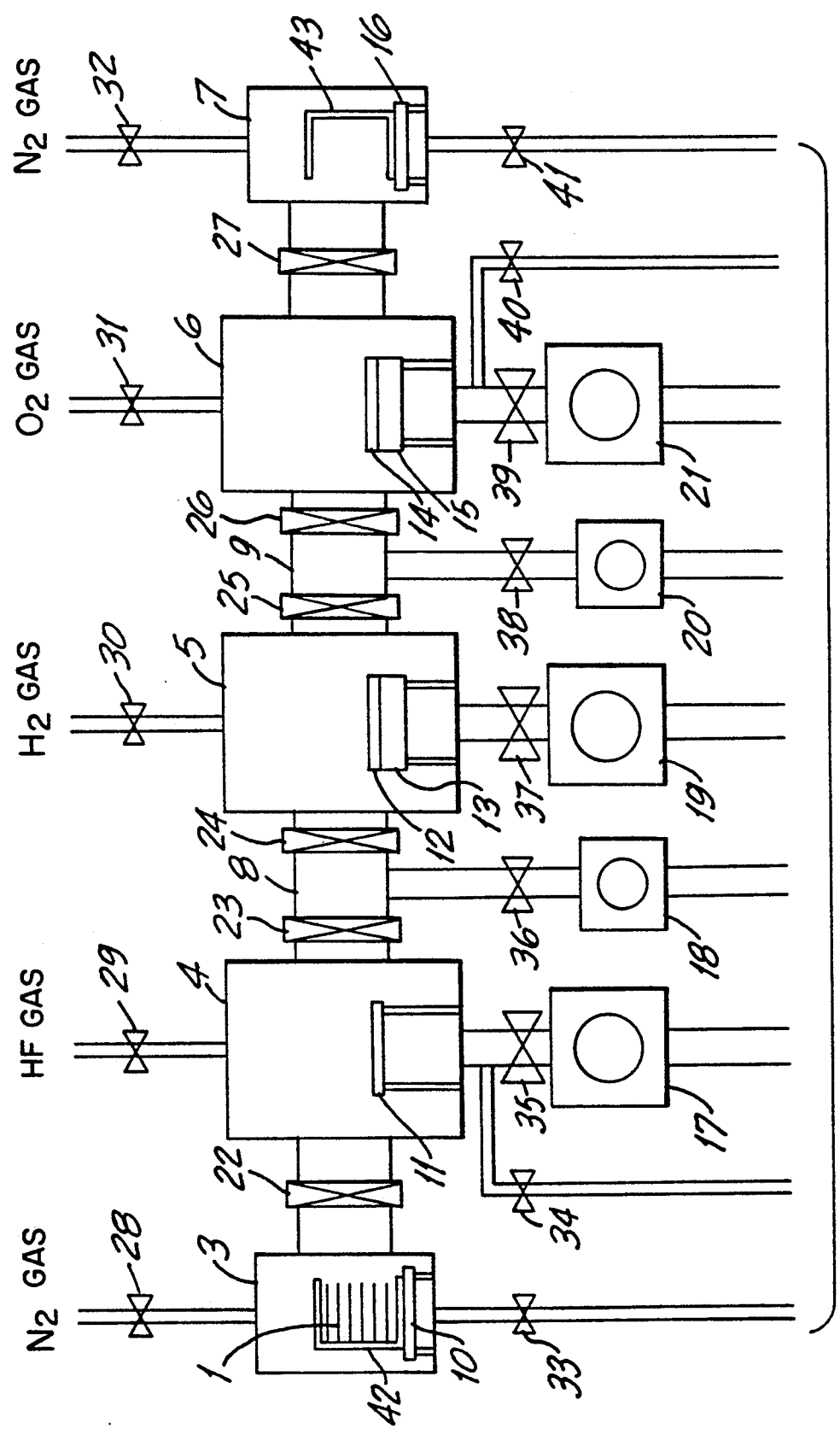
FIG. 3 is a schematic diagram showing an equipment for forming an oxide film, the equipment being a part of a manufacturing equipment according to an embodiment of the present invention.

FIG. 3 shows schematically a basic configuration of a manufacturing equipment of an embodiment for forming a gate oxide film. The oxide-film-forming equipment is basically constituted by an entrance holder chamber 3, a HF gas treatment chamber 4, a $H_2$ gas treatment chamber 5, an oxidation (treatment) chamber 6, an exit holder chamber 7, a first loading-lock chamber 8, a second loading-lock chamber 9, transferring mechanism (not shown explicitly) and accessories.

The entrance holder chamber 3 and the exit holder chamber 7 are equipped therein cassette tables 10 and 16, respectively, on each of which a wafer cassette 42 or 43 holding a plurality of substrates 1 can be disposed. Each of the entrance and exit holder chambers 3 and 7 is provided with a $N_2$ gas valve 28 or 32, such as a solenoid valve or an air-operated valve, for introducing $N_2$ gas, and also with an exhausting valve 33 or 41 for exhausting N2 gas thereby forming a $N_2$ gas purge in combination with the $N_2$ gas valve 28 or 32.

The HF gas treatment chamber 4, the $H_2$ gas treatment chamber 5 and the oxidation treatment chamber 6 are equipped therein with a susceptive member 11, 12 and 14, respectively, on each of which the wafer cassette 42 or 43 can be disposed. The susceptive members 12 and 14 are equipped with heaters 13 and 15 for heating the substrates, respectively. Those treatment chambers 4, 5 and 6 are provided with gas introduction valves 29, 30 and 31 and a vacuum equipment, respectively, each constituted by an evacuation valve 35, 37 or 39, evacuation pump 17, 19 or 21 and a duct for providing evacuation route. The HF gas treatment chamber 4 and the oxidation chamber 6 are further provided with an exhausting valve 34 and 40, respectively, for forming a gas flow therein.

Between the two adjacent treatment chambers 4 and 5 and between the two adjacent chambers 5 and 6, respectively, there are provided with a first and a second loading-lock chambers 8 and 9. Each of the first and the second loading chamber can be separated from the adjacent treatment chambers by two gate valves 23 and 24; 25 and 26. Both these loading-lock chambers 8 and 9 are also equipped with vacuum equipments each constituted by an evacuation valve 36, 38, an evacuation pump 18, 20, and a duct for providing an evacuation route. Between each of the holder chambers 3 and 7 and the respective adjacent treatment chambers 4, 6, there is provided with a duct having a gate valve 22, 27. Each of all the valves as described above is an automatic valve, such as a solenoid valve or an air-operated valve, controlled remotely from the valve.

The operation of the oxide-film-forming equipment is controlled by a CPU not shown in the drawing as follows:

Before substrates are set in the equipment the valves 28, 32, 33, 35, 36, 37, 38, 39 and 41 are kept open and all the evacuation pumps 17 to 21 are in operation. By keeping these valves open, each of the entrance holder chamber 3 and the exit holder chamber 7 is at a condition of $N_2$ purging, while each of the HF gas treatment chamber 4, the $H_2$ gas treatment chamber 5 and the oxidation chamber 6 as well as the first and the second loading-lock chambers 8 and 9 is at a condition of vacuum making. After the oxide-film-forming equipment becomes in a stable situation under those condition, wafer cassette 42 holding a plurality of substrates 1 is disposed on the cassette table 10 in the entrance holder chamber 3 as shown in the drawing.

Then, the evacuation valve 35 is closed, and the HF gas valve 29 and the exhausting valve 34 are opened. Hence, a HF gas flow is formed in the HF gas treatment chamber 4, following which the gate valve 22 is opened for introducing the substrates 1 (held by the cassette 42) from the entrance holder chamber 3 to the HF gas treatment chamber 4, then the gate valve 22 is closed. After a HF gas treatment is carried out for removal of a natural oxide film, the HF gas valve 29 and the exhausting valve 34 are closed and the evacuation valve 35 is opened. After the HF gas treatment chamber 4 is evacuated to a suitable reduced pressure, the gate valve 23 is opened and the wafer cassette 42 holding the substrates 1 is transferred to the first loading-lock chamber 8, following which the gate valve 23 is closed.

Next, the gate valve 24 is opened and the substrates 1 are introduced to the $H_2$ gas treatment chamber 5, following which the gate valve 24 is closed. The $H_2$ gas valve 30 is then opened and a $H_2$ gas of a purity of 99.9999% is introduced to the $H_2$ gas treatment chamber 5 in which the pressure is controlled equal to or below 10 Torr. By employing this purity of $H_2$ gas, inpurities such as iron, which often enters an interface between an oxide film and the surface of the substrate thereby degrading the quality of the oxide film, are excluded from the interface. A $H_2$ gas treatment of the substrates is carried out in the $H_2$ gas treatment chamber for removal of fluorine. During the step, the substrates held by the wafer cassette 42 disposed on the susceptive member 12 are heated by the heater 13 to an elevated temperature equal to or above 200° C., and treated with the $H_2$ gas at a pressure equal to or below 10 Torr. The reduced pressure accelerates the removal of the HF gas from the surface of the substrates. When the $H_2$ gas treatment is finished, the $H_2$ gas valve 30 is closed, and evacuation valve 37 is opened. Then, the gate valve 25 is opened, and the substrates 1 are transferred to the second loading-lock chamber 9.

Next, the gate valve 25 is closed and the gate valve 26 is opened, following which the substrates 1 are introduced to the oxidation chamber 6, and the gate valve 26 is closed. Then, the evacuation valve 39 is closed, and the $O_2$ gas valve 31 and the exhausting valve 40 are opened. Hence, an $O_2$ gas flow is formed inside the thermal oxidation chamber 6, and a thermal oxidation of the substrates is carried out. The substrates disposed on the susceptive member 14 are heated by the heater 15 to a temperature of about 800° C. When the thermal oxidation is finished, the gate valve 27 is opened, the substrates are transferred to the exit holder chamber 7 and then the gate valve 27 is closed. By this thermal oxidation, a gate oxide film of a superior performance and a high reliability can be formed, since a natural oxide film and the fluorine is substantially completely removed or excluded from the gate oxide film. The substrates are then taken out from the exit holder chamber 7.

To recover the initial situation of the oxide-film-forming equipment, the $O_2$ gas valve 31 and the exhausting valve 40 are closed and the evacuation valve 39 is opened. By repeating the sequence described above, oxidation of a plurality of substrates disposed on a wafer cassette is carried out in sequence.

According to the embodiment of the manufacturing equipment including the oxide-film-forming equipment as described above, since the substrates are transferred at a reduced pressure or in a vacuum from the HF gas treatment chamber to the $H_2$ gas treatment chamber and from the $H_2$ gas treatment chamber to the thermal oxidation chamber, substantially no natural oxide film is formed nor inpurities are introduced during the transferring as well as during treating the substrates. Hence, a gate oxide film of a high reliability and a superior performance can be obtained.

Since above embodiments are described only for examples, the present invention is not limited to such embodiments and it will be obvious for those skilled in the art that various modifications or alterations can be easily made based on the above embodiments under the scope of the invention.

What is claimed is:

1. A method for manufacturing a semiconductor device, comprising the steps of: cleaning a surface of a silicon substrate with a hydrofluoric acid solution; then removing a natural oxide formed on the surface of said silicon substrate from said surface with a HF gas wherein fluorine in said HF gas remains attached to the surface of said silicon substrate; then subjecting said silicon substrate to a $H_2$ gas to remove said fluorine from the surface of said silicon substrate by reacting hydrogen in said $H_2$ gas with said fluorine; and then thermally oxidizing the surface of said silicon substrate.

2. A method for manufacturing a semiconductor device as defined in claim 1 wherein said $H_2$ gas has a purity of 99.9999 percent.

3. A method for manufacturing a semiconductor device as defined in claim 1 wherein said silicon substrate is subjected to said $H_2$ gas at a temperature substantially equal to or above 200° C.

4. A method for manufacturing a semiconductor device as defined in claim 3 wherein said silicon substrate is subjected to said $H_2$ gas at a temperature substantially equal to or above 400° C.

5. A method for manufacturing a semiconductor device as defined in claim 1 wherein said silicon substrate is subjected to said $H_2$ gas at a pressure substantially equal to or below 10 Torr.

6. A method for manufacturing a semiconductor device, comprising the steps of removing a natural oxide formed on a surface of a silicon substrate of the semiconductor device from said surface with a HF gas wherein fluorine in said HF gas remains attached to the surface of said silicon substrate, then subjecting said silicon substrate without exposing said silicon substrate to air, to a $H_2$ gas to remove said fluorine from the surface of said silicon substrate by chemically reacting hydrogen in said $H_2$ gas with said fluorine to thereby form the silicon substrate having a fluorine-free and natural-oxide-free surface, and thermally oxidizing the fluorine-free and natural-oxide-free surface of said silicon substrate.

7. A method for manufacturing a semiconductor device as defined in claim 6 wherein said silicon substrate is subjected to said $H_2$ gas at a temperature of at least 200° C.

* * * * *